United States Patent
Guo et al.

(10) Patent No.: US 9,466,388 B2
(45) Date of Patent: Oct. 11, 2016

(54) READOUT CIRCUIT WITH SELF-DETECTION CIRCUIT AND CONTROL METHOD THEREFOR

(71) Applicant: CSMC TECHNOLOGIES FAB1 CO., LTD., Wuxi New District (CN)

(72) Inventors: Shuming Guo, Wuxi New District (CN); Guoyi Zong, Wuxi New District (CN)

(73) Assignee: CSMC Technologies Fabl Co., Ltd., Wuxi New District, Jiangsu (CN)

( * ) Notice: Subject to any disclaimer, the term of this patent is extended or adjusted under 35 U.S.C. 154(b) by 0 days.

(21) Appl. No.: 15/025,846

(22) PCT Filed: Oct. 10, 2014

(86) PCT No.: PCT/CN2014/088287
§ 371 (c)(1),
(2) Date: Mar. 29, 2016

(87) PCT Pub. No.: WO2015/051754
PCT Pub. Date: Apr. 16, 2015

(65) Prior Publication Data
US 2016/0232980 A1     Aug. 11, 2016

(30) Foreign Application Priority Data

Oct. 10, 2013   (CN) .......................... 2013 1 0471186

(51) Int. Cl.
| | |
|---|---|
| G11C 7/00 | (2006.01) |
| G11C 16/26 | (2006.01) |
| G11C 16/24 | (2006.01) |
| G11C 16/32 | (2006.01) |

(52) U.S. Cl.
CPC ............... G11C 16/26 (2013.01); G11C 16/24 (2013.01); G11C 16/32 (2013.01)

(58) Field of Classification Search
CPC ...................................................... G11C 16/02
USPC ..................................................... 365/189.15
See application file for complete search history.

(56) References Cited

U.S. PATENT DOCUMENTS

| | | |
|---|---|---|
| 2005/0047220 A1 | 3/2005 | Yamagami |
| 2013/0155797 A1* | 6/2013 | Hold .................. G11C 7/12 365/203 |

FOREIGN PATENT DOCUMENTS

| | | |
|---|---|---|
| CN | 1591684 | 3/2005 |
| CN | 102113057 | 6/2011 |
| CN | 102314925 | 1/2012 |
| CN | 102623038 | 8/2012 |

OTHER PUBLICATIONS

International Search Report of PCT/CN2014/088287, dated Jan. 14, 2015, and English translation thereof, 4 pages total.

* cited by examiner

*Primary Examiner* — Hoai V Ho
(74) *Attorney, Agent, or Firm* — Hamre, Schumann, Mueller & Larson, P.C.

(57) ABSTRACT

A readout circuit with a self-detection circuit and a control method therefor. The circuit comprises a pre-charging circuit and a control circuit, the pre-charging circuit and the control circuit being connected to a first node and used for charging a memory unit. The readout circuit also comprises a detection circuit, the detection circuit and the pre-charging circuit being connected to the first node. The detection circuit comprises a third NOT gate, a fourth NOT gate, a first NAND gate, a sixth NOT gate, a first trigger and an eighth NOT gate. In such a manner of detecting the reversal of the first NOT gate through the reversal of the third NOT gate, the charging duration of the first node (A) can be greatly reduced, thereby reducing the reading duration of the whole circuit. At the same time, the re-occurrence of a state of charging the circuit can be avoided after pre-charging has ended.

15 Claims, 5 Drawing Sheets

READOUT CIRCUIT WITH SELF-DETECTION CIRCUIT AND CONTROL METHOD THEREFOR

FIELD OF THE INVENTION

The present invention relates to the semiconductor field, and particularly relates to a readout circuit with a self-detection circuit and a control method thereof.

BACKGROUND OF THE INVENTION

As a storage chip without loss of data after power-off, An electrically erasable programmable read-only memory (EEPROM) has advantages of non-volatility, byte erasability, fast programming speed and the like. EEPROM is programmed without removing the EEPROM from the system, so that it is convenient, efficient and feasible to storage and update (or program) data. EEPROM makes it possible to perform the remotely programming process over radio or wires, which eliminates the light-transmission window for ultraviolet light of EEPROM. The package cost of EEPROM is low, and the test of EEPROM is simple, resulting in its widespread application.

The readout circuit is an essential part in the memory design and to a large extent decides the important parameter of a reading time of the memory. However, the current of the memory unit will drift as the manufacturing process drifts. Meanwhile, the number of the readout circuits will increase correspondingly as digits of the memory increases, resulting in a more widespread distribution of the readout circuits in the whole chip. Therefore, the readout circuits are more easily subject to some negative influences during the manufacturing process.

In the conventional solution, as shown in FIG. 1, M0 is a charge transistor and controlled by the signal Pre_charge. When the readout circuit begins to work, the Pre_charge signal is a low pulse, and right now the power source potential VDD charge the first node A by M0 to increase the potential of the first node A. As the potential of the first node A increases, the potential of the node B will reduce gradually, and the transistor M3 is turned on. Right now the first node A is pulled-up by a pull-up current, and the magnitude of this current is determined by the transistors M1 and M2. If the decoded EEPROM cell is an erased cell, i.e. the starting voltage threshold of this cell is very low, and then there will be a current flowing through EEPROM cell. The voltage of the first node A is pulled-down, and right now the corresponding Out is "0". The corresponding timing diagram is shown in FIG. 2.

Although the readout circuit can well control charging of the first node A, it easily results in false charge because there is no detection circuit in the readout circuit. Moreover, the charging speed of the readout circuit is slower, resulting in a slow reading speed of the readout circuit, which can not satisfy the great reading requirement. Therefore, it is necessary to improve the conventional readout circuit to overcome the above disadvantages.

SUMMARY OF THE INVENTION

A readout circuit with a self-detection circuit includes: a precharge circuit and a control circuit, the precharge circuit and the control circuit being connected at a first node A and being configured to charge a memory unit; the readout circuit further includes a detection circuit, the detection circuit and the precharge circuit are connected at the first node A; the detection circuit includes a third NOT gate X3, a fourth NOT gate X4, a first NAND gate X5, a sixth NOT gate X6, a first trigger X7 and an eighth NOT gate X8; wherein an input of the third NOT gate X3 is connected to the first node A, an output of the third NOT gate X3 and an input of the fourth NOT gate X4 are connected at a third node C, an output of the fourth NOT gate X4 and an input for a clock signal of the first trigger X7 are connected at a fourth node D, an inverse reset terminal of the first trigger X7 is connected to an output of the eighth NOT gate X8, an input of the eighth NOT gate X8 is connected to a first signal terminal, an output QN of the first trigger X7 is connected to an input of the first NAND gate X5, another input of the first NAND gate X5 is connected to a first read terminal, an output of the first NAND gate X5 is connected to an input of the sixth NOT gate X6, the first NAND gate X5 is further connected to the third node C.

In one of embodiments, the output of the fourth NOT gate X4 is connected to a clock signal terminal CP of the first trigger X7.

In one of embodiments, the readout circuit further includes a reset circuit; the reset circuit is connected to the precharge circuit at the first node A.

In one of embodiments, the reset circuit comprises a fourth transistor M4, a source of the fourth transistor M4 is connected to the first node A, a gate of the fourth transistor M4 is connected to the first signal terminal, a drain of the fourth transistor M4 is grounded.

In one of embodiments, the control circuit includes a first NOT gate X1 and a second NAND gate X2, wherein an input of the first NOT gate X1 is connected to the first node A, an output of the first NOT gate X1 is connected to an input of the second NAND gate X2, another input of the second NAND gate X2 is connected to the first read terminal, an output of the second NAND gate X2 is connected to an output signal terminal.

In one of embodiments, the precharge circuit includes a charge transistor (M0), a source of the charge transistor M0 is connected to a power source potential (VDD), a drain of the charge transistor M0 is connected to the first node A, and a gate of the charge transistor M0 is connected to a precharge signal.

In one of embodiments, an output of the sixth NOT gate X6 is connected to the precharge signal.

In one of embodiments, the charge transistor M0 is a P-type or N-type charge transistor.

In one of embodiments, the precharge circuit further includes a first transistor M1, a second transistor M2 and a third transistor M3; wherein the first transistor M1 and the second transistor M2 forms a mirror circuit, both sources of the first transistor M1 and the second transistor M2 are connected to the power source potential VDD, a gate of the first transistor M1 is connected to a gate of the second transistor M2, a drain of the first transistor M1 is connected to a source of the third transistor M3, a drain of the second transistor M2 is connected to a reference current, a drain of the third transistor M3 is connected to the first node A, a gate of the third transistor M3 and an output of the first NOT gate X1 are connected to a second node B.

A control method of a readout circuit includes:
step (1), configuring the first signal terminal as a high level, configuring the precharge signal as a low level, and turning the charge transistor (M0) off;
step (2), changing the first signal terminal from the high level to the low level, changing the signal of the first read terminal from the low level to the high level, so that the precharge circuit performs a charging process to charge the memory unit;

step (3), controlling a potential of the first node A to be higher than a reversal voltage of the third NOT gate X3, changing the precharge signal to the low level, so as to turn the charge transistor M0 off, and then completing a precharging process; meanwhile, reducing a potential of the second node B to turn the third transistor M3 on, controlling the reversal voltage of the third NOT gate X3 to be higher a reversal voltage of the first NOT gate X1 to ensure the charge transistor M0 is turned off after the third transistor M3 is turned on.

In one of embodiments, the step (1) includes:

changing a signal of the first signal terminal to the high level, changing a signal of the first node A to the low level, changing a signal of the output QN of the first trigger X7 to the high level, changing the first read signal to the low level, and changing the precharge signal to the low level, so as to turn the charge transistor M0 off.

In one of embodiments, the step (2) includes: changing a signal of the first signal terminal from the high level to the low level, changing signals of three inputs of the first NAND gate X5 to the high level, changing the precharge signal to the high level, so as to turn the charge transistor (M0) on and charge the first node A by the power source potential VDD.

In one of embodiments, during the charging process, the method includes: changing a signal of the fourth node D from the low level to the high level, changing a potential of the output QN of the first trigger X7 from the high level to the low level, locking the precharge signal to the low level, thereby preventing the memory unit from being charged again after the precharging process is completed.

In one of embodiments, the step (2) includes: increasing the potential of the first node A to reach the reversal voltage of the third NOT gate X3, so as to change the precharge signal to the low level and turn the charge transistor (M0) off to complete the precharging process.

In one of embodiments, the step (3) includes: increasing the potential of the first node A to reach the reversal voltage, reducing the potential of the second node B, so as to turn the third transistor M3 on, so that the potential of the first node A is clamped by the third NOT gate X3 and the third transistor M3.

In the readout circuit with a self-detection circuit described above, detection of the precharging process is implemented by arranging a detection circuit in the readout circuit. The charging time of the first node A can be saved greatly by using a manner that reversal of the first NOT gate X1 is detected by reversal of the third NOT gate X3, and then the reading time of the whole circuit can be reduced correspondingly. During the whole charging process, the potential of the fourth node D is changed from 0 to 1, the potential of the output QN of the first trigger X7 is changed from 0 to 1, so that the Pre_charge signal is locked as a 0 state, preventing the memory unit from being charged again after the precharging process is completed.

BRIEF DESCRIPTION OF THE DRAWINGS

To illustrate the technical solutions in the embodiments of the present invention or the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

Figure 1:
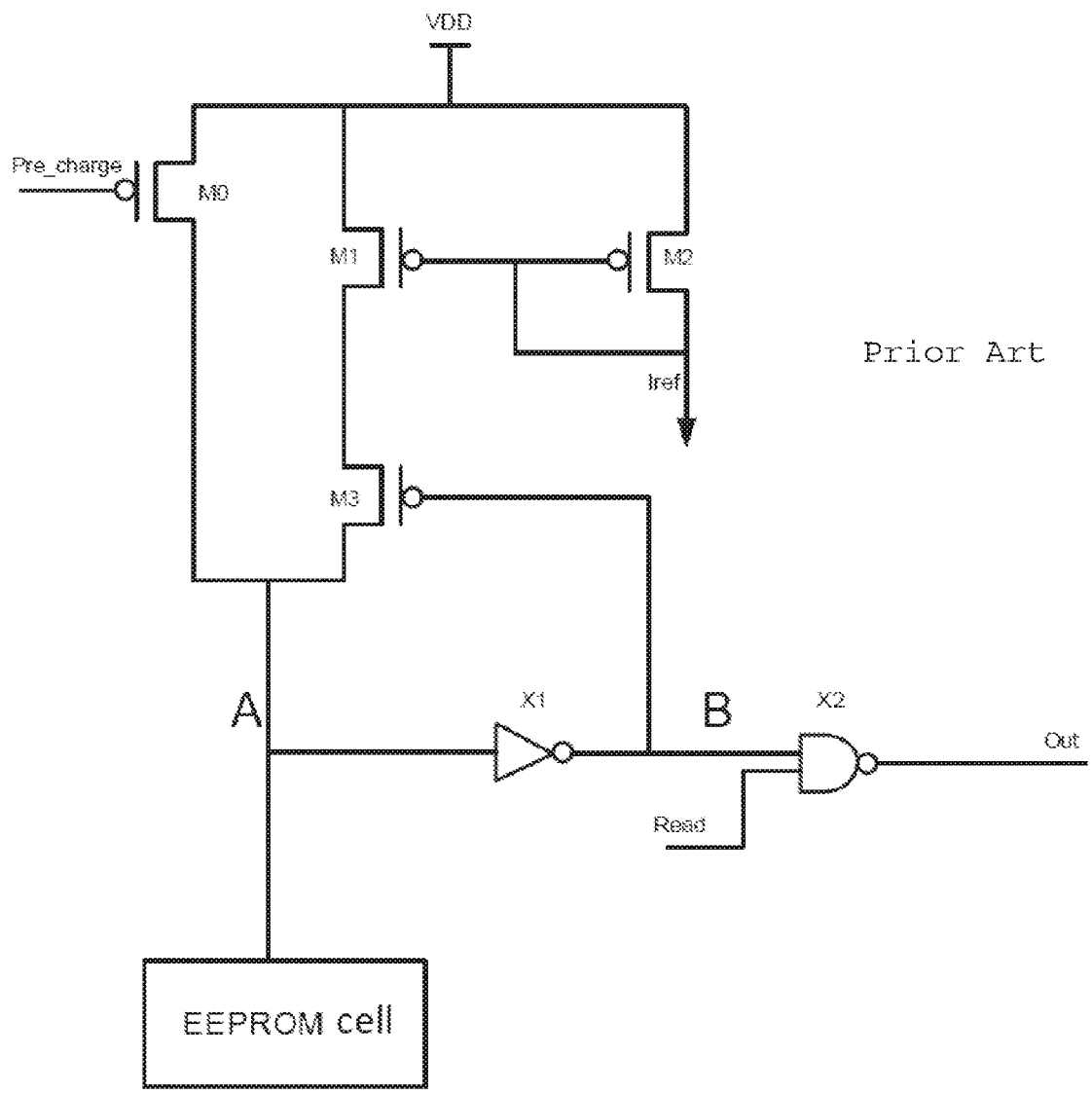
FIG. 1 is a circuit diagram of a readout circuit in a prior art.
Figure 2:
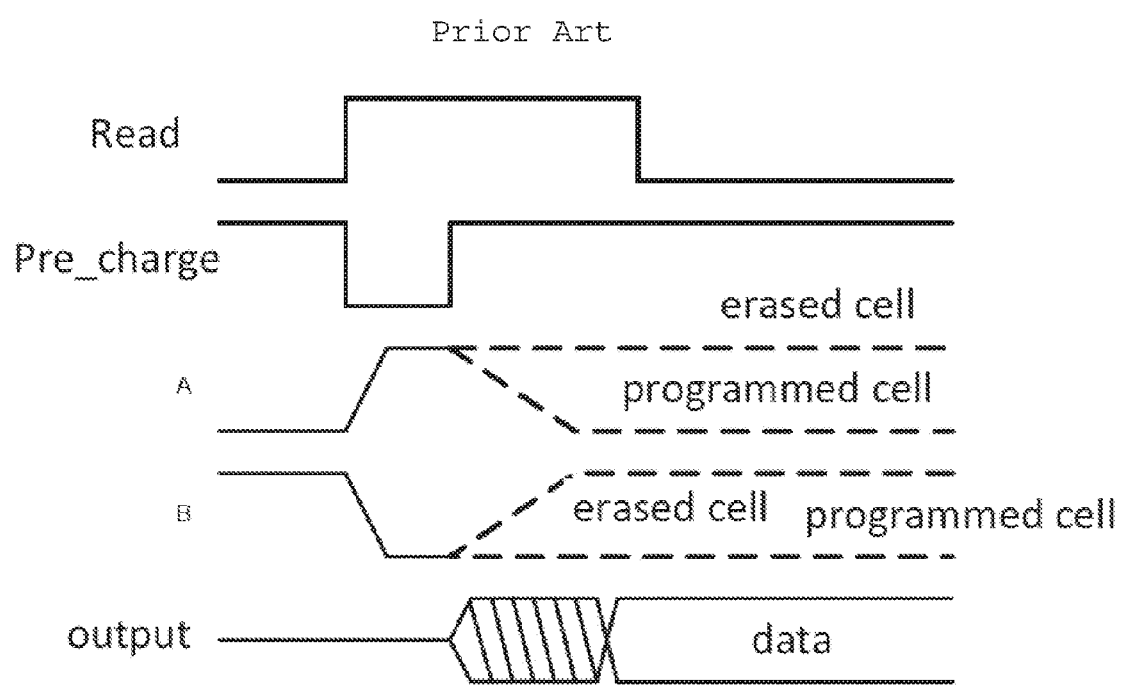
FIG. 2 is a timing diagram in the reading process of the readout circuit in the prior art.

The following description provides a large number of specific details for a thorough understanding of the present invention. However, one skilled in the art will understand that the invention may be practiced without one or more of such details. In other instances, some well-known technique features have not been described to avoid unnecessarily obscuring the present invention.

It should be noted that the terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The exemplary embodiments according to the present invention are now described with reference to the drawings. However, there exemplary embodiments can be embodied in many different forms, and should not be explained to be limited the described embodiments. It should be understood that these embodiments are provided to make disclosure of the invention thorough and complete, and the idea of these exemplary embodiments are fully presented to those skilled in the art. For clarity, the same elements have been designated with the same reference numerals in the different drawings, and then their descriptions are omitted.

Figure 3:
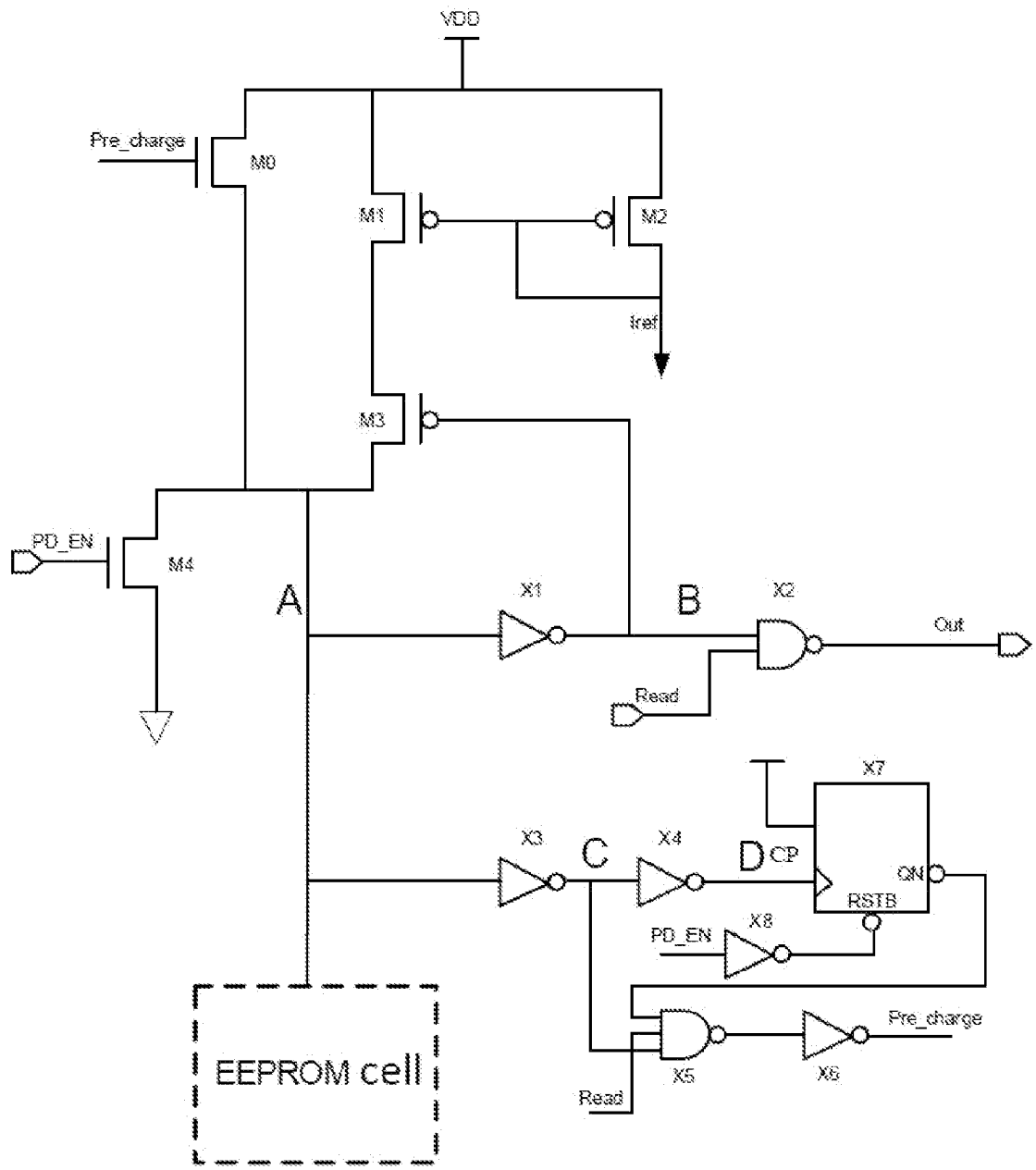
FIG. 3 is circuit diagram of a readout circuit according to an embodiment of the invention.

As shown in FIG. 3, in an embodiment, in order to solve the problems presented in the prior art, a readout circuit with a self-detection circuit is provided. The readout circuit includes a precharge circuit and a control circuit. The precharge circuit and the control circuit are connected at a first node A, and configured to charge a memory unit. The readout circuit further includes a detection circuit; the detection circuit and the precharge circuit are connected at the first node A.

The detection circuit includes a third NOT gate X3, a fourth NOT gate X4, a first NAND gate X5, a sixth NOT gate X6, a first trigger X7 and an eighth NOT gate X8.

An input of the third NOT gate X3 is connected to the first node A, an output of the third NOT gate X3 and an input of the fourth NOT gate X4 are connected at a third node C, an output of the fourth NOT gate X4 and an input for a clock signal of the first trigger X7 are connected at a fourth node D, an inverse reset terminal of the first trigger X7 is connected to an output of the eighth NOT gate X8, an input of the eighth NOT gate X8 is connected to a first signal terminal, an output QN of the first trigger X7 is connected to an input of the first NAND gate X5, another input of the first NAND gate X5 is connected to a first read terminal, an output of the first NAND gate X5 is connected to an input of the sixth NOT gate X6, the first NAND gate X5 is further connected to the third node C.

Preferably, the output of the fourth NOT gate X4 is connected to a clock signal terminal CP of the first trigger X7.

Preferably, the readout circuit further includes a reset circuit; the reset circuit is connected to the precharge circuit at the first node A.

The reset circuit includes a fourth transistor M4, a source of the fourth transistor M4 is connected to the first node A, a gate of the fourth transistor M4 is connected to the first signal terminal, a drain of the fourth transistor M4 is grounded.

Preferably, the control circuit includes a first NOT gate X1 and a second NAND gate X2, wherein an input of the first NOT gate X1 is connected to the first node A, an output of the first NOT gate X1 is connected to an input of the second NAND gate X2, another input of the second NAND gate X2 is connected to the first read terminal, an output of the second NAND gate X2 is connected to an output signal terminal.

Preferably, the precharge circuit includes a charge transistor M0, a source of the charge transistor M0 is connected to a power source potential VDD, a drain of the charge transistor M0 is connected to the first node A, and a gate of the charge transistor M0 is connected to a precharge signal.

Preferably, the charge transistor M0 can be selected as a P-type or N-type charge transistor. For the P-type charge transistor, the charging speed is slower, and the highest charging potential can be the power source potential VDD. For the N-type charge transistor, the charging speed is faster, and the highest charging potential can be VDD-VthM0. Preferably, the N-type charge transistor is used in the present invention for obtaining a faster reading speed.

Further, the precharge circuit further includes a first transistor M1, a second transistor M2 and a third transistor M3; wherein the first transistor M1 and the second transistor M2 forms a mirror circuit, both sources of the first transistor M1 and the second transistor M2 are connected to the power source potential VDD, a gate of the first transistor M1 is connected to a gate of the second transistor M2, a drain of the first transistor M1 is connected to a source of the third transistor M3, a drain of the second transistor M2 is connected to a reference current, a drain of the third transistor M3 is connected to the first node A, a gate of the third transistor M3 and an output of the first NOT gate X1 are connected at a second node B.

For selection of the reference current (Iref), two factors should be considered: the reading time and the anti-interference capacity. When Iref is selected to be higher, the anti-interference capacity is stronger but the speed of reading Programmed Cell will be reduced. When Iref is selected to be lower, the anti-interference capacity of the circuit will be reduced but the speed of reading Programmed Cell will be increased. In the present invention, Iref is designed to be adjustable, and the most proper value of Iref can be selected according to the actual test result.

A control method of the readout circuit includes:

step (1): the first signal terminal is configured as a high level, the precharge signal is configured as a low level, and the charge transistor M0 is turned off.

step (2): the first signal is changed from the high level to the low level, the signal of the first read terminal is changed from the low level to the high level, so that the precharge circuit performs a charging process to charge the memory unit.

step (3): a potential of the first node A is controlled to be higher than a reversal voltage V3 of the third NOT gate X3, the precharge signal is changed as the low level, so as to turn the charge transistor M0 off, and then a precharging process is completed. Meanwhile, a potential of the second node B is reduced to turn the third transistor M3 on. A reversal voltage of the first NOT gate X1 is V1, and V3 is controlled to be higher than V1 to ensure the charge transistor M0 is turned off after the third transistor M3 is turned on.

The working principle of the control method is as follows.

When the first signal terminal PD_EN is the high level, the circuit is on standby. At this time the first node A is pulled-down to 0 by the fourth transistor M4, the first trigger X7 is in a reset state, and the output QN of the first trigger X7 outputs 1. Because both the first reading signal and the Pre_charge signal are now 0, the charge transistor M0 is turned off.

When the first signal terminal is changed from 1 to 0, the first reading signal is correspondingly changed from 0 to 1. All signals of three inputs of the first NAND gate X5 are 1, the Pre_charge signal is 1, the charge transistor M0 is turned on, and the power source potential VDD charges the first node A by the charge transistor M0.

After the voltage of the first node A increases gradually to reach the reversal voltage V3 of the third NOT gate (the third inverter) X3, the electrical level of the third node C begins to reduce. When the electrical level of the third node C is reduced to 0, the Pre_charge signal is also changed to 0. At this time the charge transistor M0 is turned off, and then the precharging process is completed.

Because the potential of the first node A increases, and after the potential of the first node A increases to reach the reversal voltage V1 of the first NOT gate X1, the potential of the second node B reduces correspondingly, which causes the third transistor M3 to be turned on. The magnitude of the pull-up current is determined by the current of the second transistor M2 mirrored by the first transistor M1.

The reversal voltage V3 of the third NOT gate X3 and the reversal voltage V1 of the first NOT X1 are designed precisely, so that upon the potential of the first node A is larger than the reversal voltage V1 of the first NOT X1, the charging process is completed, the third transistor M3 is turned on, and the potential of the first node A is clamped by the first NOT gate X1 and the third transistor M3. In order to ensure the third transistor M3 is turned on when the charge transistor is turned off, V3 can be selected to be larger than V1.

Because the distance between the first NOT gate X1 and the third NOT X3 in the layout can be very close and their circuit structures are also very similar, values of V1 and V3 can be set much precisely by simulation, and it is not easy to generate errors in the manufacturing process.

In the present invention, the charging time of the first node A can be saved greatly by using a manner that reversal of the first NOT gate X1 is detected by reversal of the third NOT gate X3, and then the reading time of the whole circuit can be reduced correspondingly. During the whole charging process, the potential of the fourth node D is changed from 0 to 1, the potential of the output QN of the first trigger X7 is changed from 0 to 1, so that the Pre_charge signal is locked as a 0 state, preventing the memory unit from being charged again after the precharging process is completed.

Figure 4:
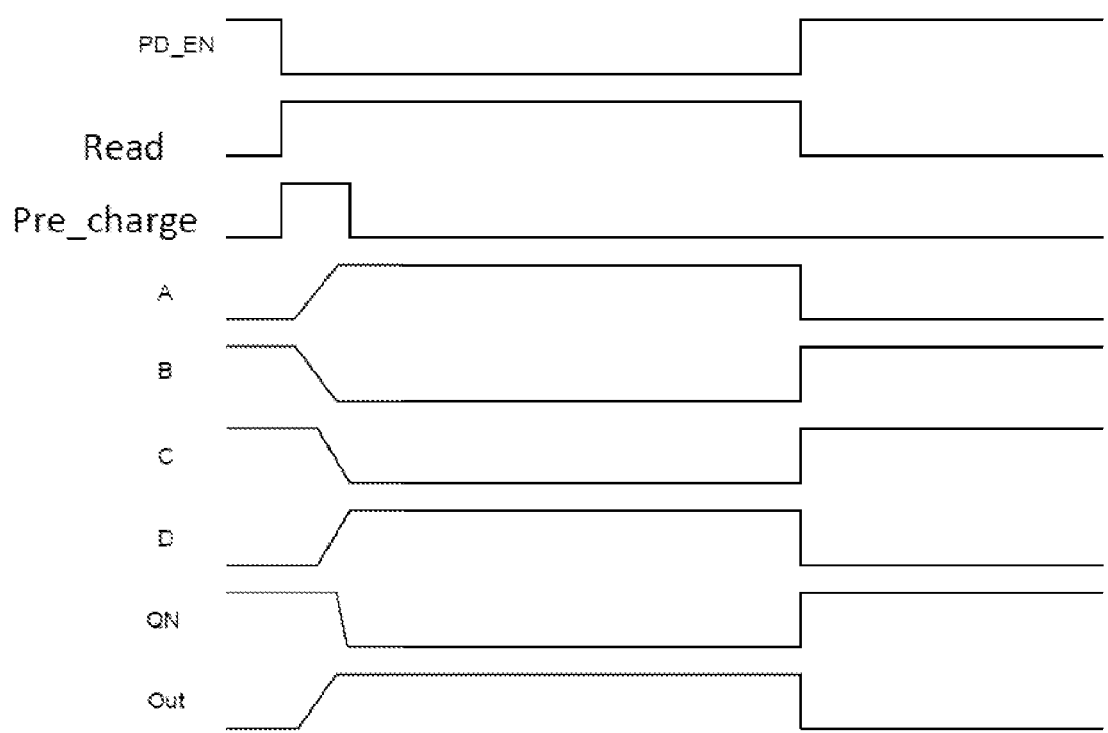
FIG. 4 is a time diagram of the high level in the reading process according to an embodiment of the invention.

After the precharging process is completed, the potential of the first node A is the high level. At this time if the decoded EEPROM is the erased cell, and because the starting voltage of the erased cell is very high, it may be now considered no current flowing through the cell, the first node A is maintained in the original state, and output thereof outputs 1. The timing diagram of the reading "1" is shown in FIG. 4.

Figure 5:
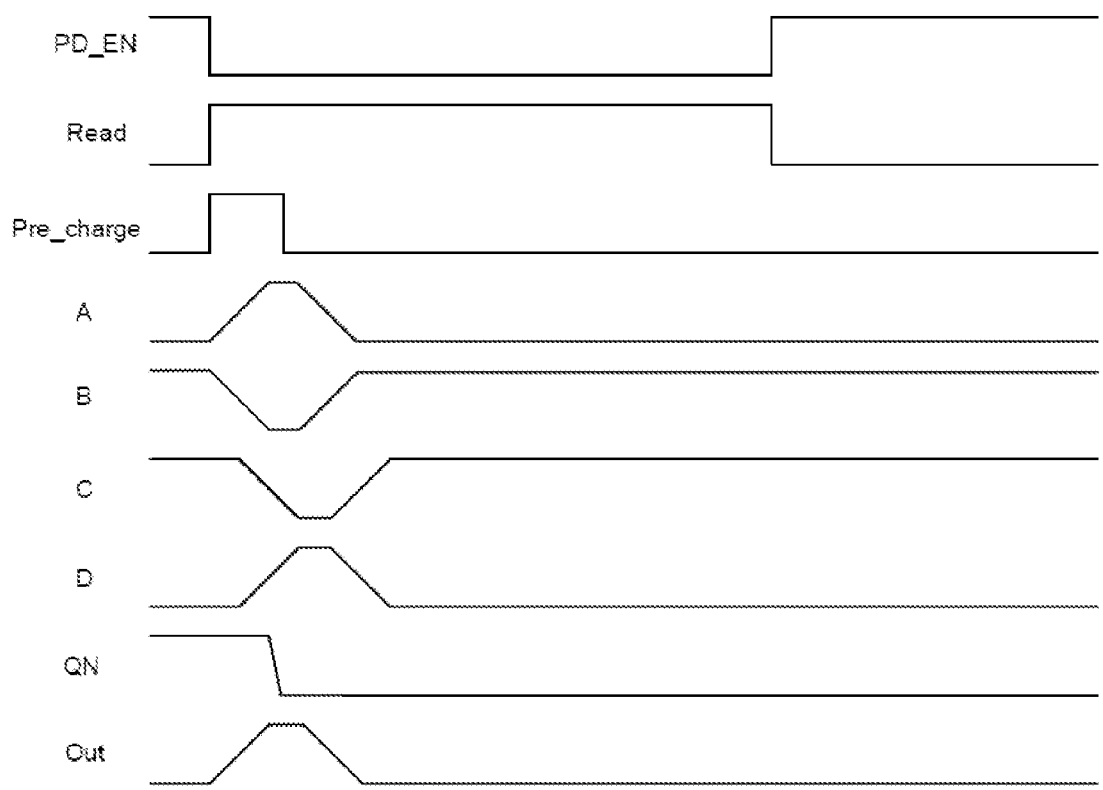
FIG. 5 is a time diagram of the low level in the reading process according to an embodiment of the invention.

If the decoded EEPROM is the programmed cell and because the starting voltage of the programmed cell is lower, a certain current (about 8 uA) flows through the cell, so that the potential of the first node A is pulled-down, and the output thereof outputs 0. The timing diagram of the reading "0" is shown in FIG. 5.

Because the potential of the first node A is clamped nearby the reversal voltage of the first NOT gate X1 after the precharging process is completed, when EEPROM cell is read there is a current flowing through EEPROM cell, then the potential of the first node A will reduce. Meanwhile, voltage of the gate of the third transistor M3 will increase, and the pull-up current will reduce, which is equivalent to a positive feedback, and can speed up the reading action. Moreover, the reading process has little relationship to the reference current and the current of EEPROM cell, which avoid negative influence of current due drifting of the manufacturing process. When the reading period is ended, the signal of the first signal terminal is recovered as 1, the signal of the first reading terminal is recovered as 0, and then the whole circuit is reset to prepare for performing a next reading operation.

In the conventional art, the first node A is charged by using the signal Pre_charge with a fixed pulse width. When there are many number of the readout circuits, because these readout circuits will widespreadly distribute across the layout, it cannot avoid some negative influences of the manufacturing process. In the present invention, the Pre_charge signal is not a signal with a fixed pulse width, and generated by a circuit formed by the third NOT gate X3, the fourth NOT gate X4, the sixth NOT gate X6, the eighth NOT gate X8, the first NAND gate X5 with three inputs and the first trigger X7.

When the signal of the first signal terminal is changed from "1" to "0" and the signal of the first reading terminal is changed from "0" to "1", the circuit performs the charging process. When the potential of the first node A is higher than the reversal voltage V3 of the third NOT gate X3, the signal of the third node C is reduced to "0". The Pre_charge signal is now "0", the charge transistor M0 is turned off, and then the circuit completes the precharging process. Meanwhile, as the potential of the first node A increases gradually, the potential of the second node B reduces gradually, and the third transistor M3 (as the pull-up transistor) begins to be turned on. If the reversal voltage of the first NOT gate X1 is V1, then when V3>V1, it will ensure the charge transistor M0 is turned off after the third transistor M3 (as the pull-up transistor) is turned on. Because the distance between the first NOT gate X1 and the third NOT gate X3 in the layout can be very close, this arrangement minimizes the negative influence of the manufacturing process.

The function of the circuit formed by the fourth NOT gate X4, the first trigger X7 and the eighth X8 is that after the first node A is precharged, D terminal of the first trigger generates a rising edge signal, so that the output QN of the first trigger X7 is set as "0". At this time it can ensure the Pre_charge signal is always "0" during the reading period after the precharging process is completed, for preventing a false charging action due to change of the first node A. After end of one reading period, the first trigger X7 is reset to prepare for a next reading period.

In the circuit design, as long as it ensure the reversal voltage V3 of the third NOT gate X3 is larger than the reversal voltage V1 of the first NOT gate X1, the circuit can successfully perform the precharging process, for avoiding design of a circuit generating a charging signal with a fixed pulse width. Meanwhile, the charging time is dependent on the reversal voltage of the third NOT gate X3. As long as the first node A is charged and its voltage is up to the reversal voltage of the third NOT gate X3, the charge transistor M0 is turned off (at this time the pull-up transistor M3 must be turned on), so that the charging time is saved and then the reading speed for data is increased.

In order to solve various problems present in the prior art, the invention improves the readout circuit by arranging a detection circuit in the readout circuit to implement detection of the precharging process. The charging time of the first node A can be saved greatly by using a manner that reversal of the first NOT gate X1 is detected by reversal of the third NOT gate X3, and then the reading time of the whole circuit can be reduced correspondingly. During the whole charging process, the potential of the fourth node D is changed from 0 to 1, the potential of the output QN of the first trigger X7 is changed from 0 to 1, so that the Pre_charge signal is locked as a 0 state, preventing the memory unit from being charged again after the precharging process is completed.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A readout circuit with a self-detection circuit, comprising: a precharge circuit and a control circuit, the precharge circuit and the control circuit being connected at a first node and being configured to charge a memory unit;

characterized in that, the readout circuit further comprises a detection circuit, the detection circuit and the precharge circuit are connected at the first node; the detection circuit comprises a third NOT gate, a fourth NOT gate, a first NAND gate, a sixth NOT gate, a first trigger and an eighth NOT gate;

wherein an input of the third NOT gate EX is connected to the first node, an output of the third NOT gate and an input of the fourth NOT gate are connected at a third node, an output of the fourth NOT gate and an input for a clock signal of the first trigger are connected at a fourth node, an inverse reset terminal of the first trigger is connected to an output of the eighth NOT gate, an input of the eighth NOT gate is connected to a first signal terminal, an output of the first trigger is connected to an input of the first NAND gate, another input of the first NAND gate is connected to a first read terminal, an output of the first NAND gate is connected to an input of the sixth NOT gate, the first NAND gate is further connected to the third node.

2. The readout circuit of claim 1, wherein, the output of the fourth NOT gate is connected to a clock signal terminal of the first trigger.

3. The readout circuit of claim 1, wherein, the readout circuit further comprises a reset circuit; the reset circuit is connected to the precharge circuit at the first node.

4. The readout circuit of claim 3, wherein, the reset circuit comprises a fourth transistor, a source of the fourth transistor is connected to the first node, a gate of the fourth transistor is connected to the first signal terminal, and a drain of the fourth transistor is grounded.

5. The readout circuit of claim 1, wherein, the control circuit comprises a first NOT gate and a second NAND gate, wherein an input of the first NOT gate is connected to the first node, an output of the first NOT gate is connected to an input of the second NAND gate, another input of the second NAND gate is connected to the first read terminal, an output of the second NAND gate is connected to an output signal terminal.

6. The readout circuit of claim 1, wherein, the precharge circuit comprises a charge transistor a source of the charge transistor is connected to a power source potential, a drain of the charge transistor is connected to the first node, and a gate of the charge transistor is connected to a precharge signal.

7. The readout circuit of claim 6, wherein, an output of the sixth NOT gate is connected to the precharge signal.

8. The readout circuit of claim 6, wherein, the charge transistor is a P-type or N-type charge transistor.

9. The readout circuit of claim 5, wherein, the precharge circuit further comprises a first transistor, a second transistor and a third transistor wherein the first transistor and the second transistor forms a mirror circuit, both sources of the first transistor and the second transistor are connected to the power source potential, a gate of the first transistor is connected to a gate of the second transistor, a drain of the first transistor is connected to a source of the third transistor, a drain of the second transistor is connected to a reference current, a drain of the third transistor is connected to the first node, a gate of the third transistor and an output of the first NOT gate are connected to a second node.

10. A control method of a readout circuit of claim 1, comprising:
    step (1), configuring the first signal terminal as a high level, configuring the precharge signal as a low level, and turning the charge transistor off;
    step (2), changing the first signal terminal from the high level to the low level, changing the signal of the first read terminal from the low level to the high level, so that the precharge circuit performs a charging process to charge the memory unit; and
    step (3), controlling a potential of the first node to be higher than a reversal voltage of the third NOT gate, changing the precharge signal to the low level, so as to turn the charge transistor off, and then completing a precharging process; meanwhile, reducing a potential of the second node to turn the third transistor on, controlling the reversal voltage of the third NOT gate to be higher a reversal voltage of the first NOT gate to ensure the charge transistor is turned off after the third transistor is turned on.

11. The control method of the readout circuit of claim 10, wherein, the step (1) comprises:
    changing the first signal terminal to the high level, changing the first node to the low level, changing the output of the first trigger to the high level, changing the first read signal to the low level, and changing the precharge signal to the low level, so as to turn the charge transistor off.

12. The control method of the readout circuit of claim 10, characterized in that wherein, the step (2) comprises:
    changing the first signal terminal from the high level to the low level, changing signals of three inputs of the first NAND gate to the high level, changing the precharge signal to the high level, so as to turn the charge transistor on and charge the first node by the power source potential.

13. The control method of the readout circuit of claim 12, wherein, during the charging process, the method comprises:
    changing the fourth node from the low level to the high level, changing a potential of the output of the first trigger from the high level to the low level, locking the precharge signal to the low level, thereby preventing the memory unit from being charged again after the precharging process is completed.

14. The control method of the readout circuit of claim 10, wherein, the step (2) comprises:
    increasing the potential of the first node to reach the reversal voltage of the third NOT gate, so as to change the precharge signal to the low level and turn the charge transistor off to complete the precharging process.

15. The control method of the readout circuit of claim 10, wherein, the step (3) comprises:
    increasing the potential of the first node to reach the reversal voltage, reducing the potential of the second node, so as to turn the third transistor on, so that the potential of the first node is clamped by the third NOT gate and the third transistor.

* * * * *